(12) United States Patent
Mearini et al.

(10) Patent No.: US 6,893,500 B2
(45) Date of Patent: May 17, 2005

(54) METHOD OF CONSTRUCTING OPTICAL FILTERS BY ATOMIC LAYER CONTROL FOR NEXT GENERATION DENSE WAVELENGTH DIVISION MULTIPLEXER

(75) Inventors: Gerald T. Mearini, Shaker Heights, OH (US); Laszlo Takacs, Shaker Heights, OH (US)

(73) Assignee: Atomic Telecom, Cleveland, OH (US)

( * ) Notice: Subject to any disclaimer, the term of this patent is extended or adjusted under 35 U.S.C. 154(b) by 0 days.

(21) Appl. No.: 09/865,152

(22) Filed: May 24, 2001

(65) Prior Publication Data

US 2002/0003664 A1 Jan. 10, 2002

Related U.S. Application Data

(60) Provisional application No. 60/206,934, filed on May 25, 2000, provisional application No. 60/207,100, filed on May 25, 2000, and provisional application No. 60/207,101, filed on May 25, 2000.

(51) Int. Cl.$^7$ .............................................. C30B 25/16
(52) U.S. Cl. ...................... 117/89; 117/948; 117/949; 427/9; 427/10
(58) Field of Search .......................... 117/89, 948, 949, 117/85, 86; 427/8, 9, 10, 255.7

(56) References Cited

U.S. PATENT DOCUMENTS

| | | | |
|---|---|---|---|
| 4,747,922 A | | 5/1988 | Sharp |
| H566 H | * | 1/1989 | Nyaiesh et al. ................ 427/38 |
| 5,200,021 A | * | 4/1993 | Kawai et al. ................. 156/601 |
| 5,241,214 A | * | 8/1993 | Herbots et al. .............. 257/649 |
| 5,403,433 A | * | 4/1995 | Morrison et al. ........... 156/626 |
| 5,529,671 A | | 6/1996 | Debley et al. |
| 5,629,532 A | * | 5/1997 | Myrick ......................... 257/77 |
| 5,637,530 A | * | 6/1997 | Gaines et al. ................ 114/105 |
| 5,712,724 A | * | 1/1998 | Klocek et al. ............... 359/350 |
| 5,725,413 A | | 3/1998 | Malshe et al. |
| 5,748,350 A | | 5/1998 | Pan et al. |
| 5,753,319 A | * | 5/1998 | Knapp et al. ................ 427/529 |
| 6,160,661 A | * | 12/2000 | Klocek et al. ............... 359/359 |
| 6,205,270 B1 | | 3/2001 | Cao |
| 6,233,261 B1 | | 5/2001 | Mesh et al. |
| 6,573,030 B1 | * | 6/2003 | Fairbairn et al. ........... 430/323 |

OTHER PUBLICATIONS

Kumar, et al.; *Near–Infrared Bandpass Filter from Si/SiO$_2$; Multilayer Coatings*; Feb. 1999.

Suntola, T.; *Cost–Effective Processing by Atomic Layer Epitaxy*; 1993.

Bachman, et al.; *Molecular Layer Expitaxy by Real–Time Optical Process Monitoring*; Department of Materials Science and Engineering, North Carolina State University, 1997.

H., Kawai, T. Tabata; *Atomic Layer Control of the Growth of Oxide Superconductors Using Laser Molecular Beam Epitaxy*; 1997.

Spiller, E;*Smoothing of Multilayer X–Ray Mirrors by Ion Polishing*; IBM Research Division, Thomas J. Watson; 1993.

Puik, E.J., van der Wiel and Zeijlemaker, H, and Verhoeven, J.; *Ion Etching of Thin W Layers: Enhancing Reflectivity of W–C Multilayer Coatings*; Mar. 30, 1989.

Nishizawa, J., Abe, H., and Kurabayshi, T.J. 132(5) (1985).

Puik, E.J., et al.; *Appln. Surf. Sci.* 47 (1991) 251.

Kloidt, A, et al.; *Thin Sol Films*, 228 (1993) 154.

Imai, F., Kunimori, K., and Nozoye, H; *Novel Epitaxial Growth Mechanism of Magnesium Oxide/Titanium Oxide Ceramics Superlattice Thin Films Observed by Reflection High–Energy Electron Diffraction*; Nov. 8, 1993.

* cited by examiner

Primary Examiner—Bret Chen
(74) Attorney, Agent, or Firm—Duane Morris LLP

(57) ABSTRACT

A method of constructing optical filters using alternating layers of materials with "low" and "high" indices of refraction and deposited with atomic layer control. The multilayered thin film filter uses, but is not limited to, alternating layers of single crystal, polycrystalline or amorphous materials grown with self-limiting epitaxial deposition processes well known to the semiconductor industry. The deposition process, such as atomic layer epitaxy (ALE), pulsed chemical beam epitaxy (PCB E), molecular layer epitaxy (MLE) or laser molecular beam epitaxy (laser MBE) can result in epitaxial layer by layer growth and thickness control to within one atomic layer. The alternating layers are made atomically smooth using a Chemical Reactive-Ion Surface Planarization (CRISP) process. Intrinsic stress is monitored using an in-situ cantilever based intrinsic stress optical monitor and adjusted during filter fabrication by deposition parameter modification. The resulting filter has sufficient individual layer thickness control and surface roughness to enable ~12.5 GHz filters for next generation multiplexers and demultiplexers with more than 1000 channels in the wavelength range 1.31–1.62 μm.

25 Claims, 1 Drawing Sheet

Figure 1:
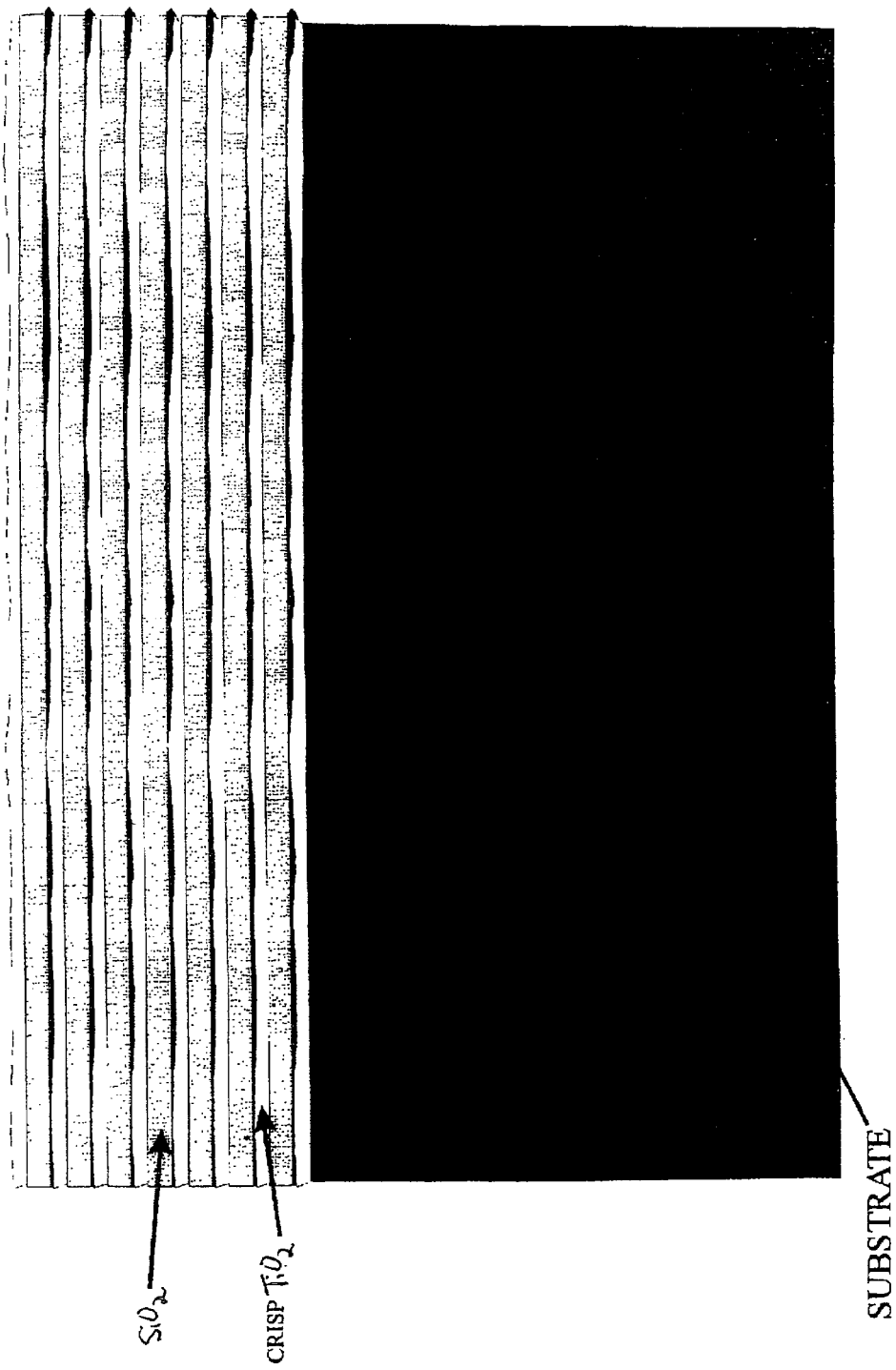

METHOD OF CONSTRUCTING OPTICAL FILTERS BY ATOMIC LAYER CONTROL FOR NEXT GENERATION DENSE WAVELENGTH DIVISION MULTIPLEXER

This application claims priority to U.S. Provisional Patent Application Ser. No. 60/206,934, entitled OPTICAL FILTER CONSTRUCTION BY ATOMIC LAYER CONTROL FOR NEXT GENERATION DENSE WAVELENGTH DIVISION MULTIPLEXER, filed on May 25, 2000, U.S. Provisional Patent Application Ser. No. 60/207,100, entitled ATOMIC LAYER CONTROLLED OPTICAL FILTER DESIGN FOR NEXT GENERATION DENSE WAVELENGTH DIVISION MULTIPLEXER, filed on May 25, 2000, and U.S. Provisional Patent Application Ser. No. 60/207,101, entitled CHEMICAL-ORGANIC PLANARIZATION PROCESS FOR ATOMICALLY SMOOTH INTERFACES, filed on May 25, 2000. The present invention relates to an oxygen ion process called Chemical Reactive-Ion Surface Planarization (CRISP) which reduces the surface roughness of thin film surfaces at the atomic level.

I. BACKGROUND OF THE INVENTION

A. Field of the Invention

B. Description of the Related Art

The present invention contemplates a new and improved process for reducing the surface roughness of thin films which is simple in design, effective in use, and overcomes the foregoing difficulties and others while providing better and more advantageous overall results.

There are many commercial applications for thin films and, in particular, multilayer films. One particularly promising application is the use of these films in fiber-optic networks. Multilayered films are used in Dense Wavelength Division Multiplexers/Demultiplexers (DWDM) systems which enable information to be delivered inside the fiber optic cables at multiple wavelengths.

The ability to transmit data via fiber optic cables has become of increasing importance in this technological age. At the present time, the installation of a world-wide fiber-optic network is in progress which will be capable of handling levels of data transmission inconceivable only several years ago. As a result of this network, the Internet is less than half a decade away from being a more useful tool than the computers which navigate it. As the biggest technological revolution in the history of modern civilization progresses, advanced high performance coatings have emerged as the enabling technology. The ability to control transmission and reflection of selected wavelengths of light has enabled existing fiber to accommodate the increase in bandwidth which will be required over the next 3–5 years.

Dense Wavelength Division Multiplexers/Demultiplexer (DWDM) systems enable information to be delivered inside fiber-optic cables at multiples wavelengths. The increase in the bandwidth is limited only by the number of wavelengths which can be superimposed on the fiber. Current state-of-the-art DWDMs can multiplex/demultiplex approximately 130+ channels. Ultimately more than 1000 channels will be possible. During transmission, information is packaged within phase modulated carriers at specific wavelengths and superimposed (multiplexing) on the fiber. During reception, the carriers must be separated (demultiplexing). Optical component technology such as DWDMs are critical to achieve bandwidth necessary for future interactive services such as "video on demand," and have prompted multi-billion dollar strategic acquisitions such as OCLI, NetOptix, and XROS.

The most widely used technology for multiplexing and demultiplexing in DWDM systems is thin film-based. Multilayered thin dielectric coatings are comprised of 150–200 layers with individual optical layer thickness equal to multiples of ¼ of the wavelength to be transmitted (known as dielectric interference filters). A collection of such filters coupled together, each differing slightly in design to allow light transmission of different wavelengths, and "connected" to a fiber-optic cable enables the multiplexing (superposition) and demultiplexing (separation) of multiple wavelengths of laser light containing digital information.

Current thin film multiplexers and demultiplexers can handle up to 40 different wavelengths but several manufacturers have announced 80 channel versions in year 2000. With current state-of-the-art deposition processes used for DWDM, 80 channel multiplexers will approach the limit of the technology. Theoretical thin film filter designs exist with Full Width at Half Maximum (FWHM) of less than 0.1 nm. Such a filter would enable multiplexers capable of handling more than 1000 channels.

Thin film coatings designed to permit light transmission/reflection over narrow (0.1–25 nm) and broad (>25 nm) pass bands are typically comprised of multiple layers of two or more optically matched materials of "high" and "low" indices of refraction. The individual layer thickness and number of layers will ultimately define the optical performance of the filter. Typical narrow band filters (called "high performance") may have more than 100 individual layers.

High performance dielectric thin film optical filters are produced in volume for state-of-the-art multiplexers and demultiplexers used in DWDM systems. These filters are produced with materials such as $SiO_2$ and $Ta_2O_5$ deposited with processes such as ion beam sputter deposition (ISBD) and ion-assisted deposition (IAD). Filters produced with these processes are stable under adverse environmental conditions but lack necessary thickness and roughness control to multiplex/demultiplex more than 80 channels in the desired wavelength range. This is primarily due to excessive roll off of the filter which leads to full width at half maximum (FWHM) of greater than 2 nm (250 GHz).

Surface roughness at interfaces and thickness control are critical factors in determining the performance of a narrow bandpass filter. State-of-the-art filters will incorporate interfacial roughness which increases exponentially with layer number and is ultimately greater than 10% of the layer thickness. Furthermore, in-situ optical and physical thickness monitoring techniques are accurate to within 0.5%. This level of layer control has enabled narrow bandpass filters on the order of 1 nm FWHM (125 GHz).

Surface roughness reduction and interface smoothing by ion bombardment has been examined extensively for multilayered films designed for x-ray reflectors. In that collection of work it was observed that, by ion polishing the film surfaces using $Ar^+$ or $O^+$ ions accelerated from an ion source, surface roughness ($R_a$) was reduced by a factor of 2. It was also observed that deposition of a thin amorphous carbon (C) layer at each interface, between layers of multilayered reflectors, was successful at reducing interface roughness.

Diamond-like carbon (DLC) produced with plasma-based processes such as ion beam deposition (IBD) and plasma enhanced chemical vapor deposition (PECVD) is a smooth, amorphous and virtually lossless carbon coating. Since the material can be made more than 99% transmissive in the infrared (IR, 800 nm–15 $\mu$m) and has a refractive index of n=2.0, it is commonly used for many IR window applications. Intrinsic stress is compressive and can be quite high ultimately leading to cracking and delamination in coatings greater than 3.0 $\mu$m thick. These coatings are also used for anti-abrasion since DLC produced with ion beam processes such as IBD or PECVD is a very hard low surface roughness amorphous carbon coating.

Diamond-like carbon (DLC), and other forms of amorphous carbon, can be stripped from substrates by exposing the surface to an energetic (>50V) oxygen plasma. The energetic oxygen ions react chemically with the carbon surface to form carbon monoxide (CO). The vapor pressure of CO is high enough, at the vacuum level at which this process is performed ($\sim 10^{-2}$ torr), that the CO molecules evaporate from the surface. The freshly exposed surface carbon then reacts with the plasma and the process continues until the oxygen plasma is extinguished or no amorphous carbon remains.

II. SUMMARY OF THE INVENTION

An optical filter has been developed which uses, but is not limited to, alternating layers of high index materials such as titanium oxide ($TiO_2$, n=2.2 @ 1.55 $\mu$m), amorphous silicon (Si, n=3.46 @ 1.55 $\mu$m), and tantalum pentoxide ($Ta_2O_5$, n=2.05 @ 1.55 $\mu$m), and low index materials such as silicon dioxide ($SiO_2$, n=1.45 @ 1.55 $\mu$m) and magnesium fluoride ($MgF_2$, n=1.35 @ 1.55 $\mu$m), to enable next generation multiplexers and demultiplexers for DWDM systems. The optical filter is unique in that it uses atomic layer deposition processes commonly used in the semiconductor industry and a Chemical Reactive-Ion Surface Planarization (CRISP) process to produce atomically smooth ($R_a$<0.01 nm) interfaces. The filter will enable narrow bandpass filters of ~12.5 GHz with the necessary environmental stability to construct next generation optical communications hardware.

In accordance with one aspect of the present invention, a process for optical filter construction includes the steps of growing high index layers via a self-limiting deposition process chosen from the group comprising: atomic layer epitaxy, pulsed chemical beam epitaxy, molecular layer epitaxy, and laser molecular beam epitaxy, growing low index layers, depositing the high and low index layers onto a substrate, monitoring, during deposition, the layer growth, the high index layer being monitored via reflection high energy electron diffraction (or a similar in-situ technique), the low index layer being monitored via interferometric technique capable of sub-angstrom resolution, monitoring intrinsic stress using an in-situ cantilever-based intrinsic stress optical monitor, adjusting the intrinsic stress via deposition parameter modification, monitoring indices of refraction during deposition via an in-situ ellipsometer, measuring surface roughness using a reflection technique chosen from the group comprising: p-polarized reflection spectroscopy, phase modulated ellipsometry, and real-time atomic force microscopy, depositing approximately a 1–10 nanometer thick first layer of amorphous diamond-like (or optically similar) carbon onto the layer, directing a well-focused oxygen ion beam onto the carbon coated layer at near grazing incidence, rastering the ion beam in a sweeping fashion to allow interaction with only the carbon which protrudes above average surface height, the rastering being continued until a top layer of carbon is reduced to the level of the highest peaks in the layer, and repeating the process as necessary, alternating the high and low index layers.

In accordance with another aspect of the present invention, a process for optical filter construction includes the steps of depositing at least one layer, the layer chosen from the group comprising high index and low index, onto a substrate, monitoring layer growth, monitoring intrinsic stress, adjusting intrinsic stress, if necessary, monitoring indices of refraction, depositing amorphous carbon onto the at least one layer, directing an ion beam onto the carbon coated layer, and reducing the carbon layer until the carbon layer is approximately atomically smooth.

In accordance with yet another aspect of the present invention, the process includes depositing a high index layer onto a substrate.

In accordance with still another aspect of the present invention, the process includes depositing a low index layer onto the carbon coated high index layer, monitoring layer growth, monitoring intrinsic stress, adjusting intrinsic stress, if necessary, monitoring indices of refraction, depositing amorphous carbon onto the low index layer, directing an ion beam onto the carbon coated low index layer, and reducing the carbon layer until the carbon layer is approximately atomically smooth.

In accordance with another aspect of the present invention, the process includes depositing at least one high index layer, the layer chosen from the group comprising: titanium dioxide, amorphous silicon, and tantalum pentoxide, onto a fused silica substrate.

In accordance with yet another aspect of the present invention, the process includes depositing a low index layer, the layer chosen from the group comprising: silicon dioxide and magnesium fluoride, onto a fused silica substrate.

Still other benefits and advantages of the invention will become apparent to those skilled in the art upon a reading and understanding of the following detailed specification.

III. BRIEF DESCRIPTION OF THE DRAWINGS

The invention may take physical form in certain parts and arrangement of parts. At least one embodiment of these parts will be described in detail in the specification and illustrated in the accompanying drawing, which form a part of this disclosure and wherein:

FIG. 1 is an illustration showing the inventive multilayered optical filter.

IV. DESCRIPTION OF THE INVENTION

Referring now to the drawings, which are for purposes of illustrating at least one embodiment of the invention only, and not for purposes of limiting the invention, FIG. 1 shows an optical filter which uses alternating layers of high index materials such as, but not limited to, titanium dioxide ($TiO_2$, n=2.2 @ 1.55 $\mu$m), amorphous silicon (Si, n=3.46 @ 1.55 $\mu$m), and tantalum pentoxide ($Ta_2O_5$, n=2.05 @ 1.55 $\mu$m), and low index materials such as, but not limited to, silicon dioxide ($SiO_2$, n=1.45 @ 1.55 $\mu$m) and magnesium fluoride ($MgF_2$, n=1.35 @ 1.55 $\mu$m).

The high index layers are grown with a self-limiting deposition process, which include, but are not limited to, atomic layer epitaxy (ALE), pulsed chemical beam epitaxy (PCBE), molecular layer epitaxy (MLE), or molecular beam epitaxy (MBE), which can result in layer-by-layer growth. In some cases a polycrystalline or amorphous layer will grow but the atomic layer control is maintained. The low index materials exhibit the same growth behavior ($SiO_2$ is typically amorphous at the desired deposition temperatures). For materials which grow epitaxially, reflection high energy electron diffraction (RHEED) can be used to monitor layer growth during deposition. For layers which are amorphous, in this embodiment, layer thickness is monitored during deposition using an interferometric technique which is capable of sub-angstrom resolution. These monitoring processes enable thickness control to within one atomic layer.

Although each layer can be controlled to within one atomic layer, surface roughness plays a major role in determining filter performance. The epitaxial processes which enable atomic layer control produce surfaces with roughness on the order of 0.1 nm. This is insufficient to produce filters on the order of 12.5 GHz. The surface roughness is measured in-situ using a reflection technique which include, but are not limited to, p-polarized reflection spectroscopy (PRS), phase modulated ellipsometry (PME) or real time atomic force microscopy (AFM).

In this embodiment, after the surface roughness has been determined, a surface planarization process is employed. The process uses the surface roughness reduction effect of oxygen ions along with the reactive nature of amorphous carbon in an oxygen ion environment to planarize vacuum grown thin films. At the end of a layer deposition, the thin film which remains is a high quality dielectric film on the order of 150 nm thick with a surface roughness of ~0.1 nm. At that time a very thin layer of amorphous diamond-like carbon, approximately 1–10 nm thick, is deposited by PECVD, IBD, or some similar process.

After the carbon layer is deposited a well-focused oxygen ion beam is directed onto the carbon-coated surface at near grazing incidence. The ion beam energy is set high enough to minimize the spread of the beam. The ion beam is rastered in a sweeping fashion so as to allow interaction with only the carbon which protrudes up above the average surface height. This process is maintained until the top layer of carbon has been reduced to the level of the highest peaks in the surface of the thin film (e.g. $SiO_2$). This has the ultimate effect of filling in the valleys and leveling the initially rough surface.

A representative filter is shown in FIG. 1 which depicts epitaxially grown $TiO_2$ with atomic layer control, and alternating layers of amorphous $SiO_2$ made atomically smooth using the planarization process. Each surface can be planarized if necessary. The optical properties of the amorphous carbon layer must be incorporated into the final design of the filter. If individual layer surface roughness does not require further planarization, the process is used only when necessary. The planarization process is performed until the surface roughness is reduced to approximately less than 0.01 nm.

Alternating layers of high and low index materials are produced and prepared in the above fashion until the filter is complete. Intrinsic stress is monitored using an in-situ cantilever-based intrinsic stress optical monitor and adjusted during filter fabrication by deposition parameter modification. The intrinsic stress, if uncontrolled, may eventually cause the film to crack or delaminate from the substrate. Since modification of the deposition parameters may affect the index of refraction of the individual layers, an in-situ ellipsometer is used to monitor the indices of refraction during deposition. If the index of any given layer is changed due to a change in deposition parameters, the filter design is adjusted mid-deposition to accommodate the change. This is possible due to the atomic layer and sub-angstrom thickness control of the individual layers.

The resulting filter has sufficient individual layer thickness control and surface roughness to enable ~12.5 GHz filters for next generation multiplexers and demultiplexers with more than 1000 channels in the wavelength range 1.31–1.62 μm.

The invention has been described with reference to at least one embodiment. Obviously, modifications and alterations will occur to others upon a reading and understanding of the specification. It is intended by applicant to include all such modifications and alterations insofar as they come within the scope of the appended claims or the equivalents thereof.

Having thus described the invention, it is now claimed:

1. A process for optical filter construction, the process comprising the steps of:

growing layers having a high index of refraction via a self-limiting deposition process selected from the group consisting of atomic layer epitaxy, pulsed chemical beam epitaxy, molecular layer epitaxy, and laser molecular beam epitaxy;

growing layers having a low index of refraction;

depositing the high and low index layers onto a substrate;

monitoring, during deposition, the layer growth, the high index layer being monitored via reflection high energy electron diffraction, the low index layer being monitored via interferometric technique capable of sub-angstrom resolution;

monitoring intrinsic stress using an in-situ cantilever-based intrinsic stress optical monitor;

adjusting the intrinsic stress via deposition parameter modification;

monitoring indices of refraction during deposition via an in-situ ellipsometer;

measuring surface roughness using a reflection technique selected from the group consisting of: p-polarized reflection spectroscopy, phase modulated ellipsometry, and real-time atomic force microscopy;

depositing approximately a 1–10 nanometer thick first layer of amorphous diamond-like carbon onto at least one layer;

directing an oxygen ion beam onto the at least one carbon coated layer;

rastering the ion beam in a sweeping fashion to allow interaction with only the carbon which protrudes above average surface height, the rastering being continued until a top layer of carbon is reduced to the level of the highest peaks in the layer; and, repeating the process as necessary, alternating the high and low index layers.

2. A process for optical filter construction, the process comprising the steps of:

depositing at least one layer of material having either a high or low index of refraction onto a substrate;

monitoring layer growth;

monitoring intrinsic stress;

adjusting intrinsic stress;

monitoring indices of refraction;

depositing amorphous carbon onto the at least one layer; and smoothing the carbon coated layer by directing an ion beam onto the carbon coated layer.

3. The process of claim 2 comprising the step of:

depositing a layer having a high index of refraction onto a substrate.

4. The process of claim 3, wherein the process further comprises the steps of:

depositing a layer having a low index of refraction onto the carbon coated high index layer;

monitoring layer growth;

monitoring intrinsic stress;

adjusting intrinsic stress;

monitoring indices of refraction;

depositing amorphous carbon onto the low index layer; and smoothing the carbon coated layer by directing an ion beam onto the carbon coated low index layer.

5. The process of claim 4, wherein depositing at least one layer onto a substrate comprises the step of:

depositing at least one layer of material selected from the group consisting of: titanium dioxide, amorphous silicon, and tantalum pentoxide, onto a fused silica substrate.

6. The process of claim 5, wherein depositing a layer of material having a low index of refraction onto the carbon coated high index layer comprises the step of:

depositing a layer of material selected from the group consisting of: silicon dioxide and magnesium fluoride, onto a fused silica substrate.

7. The process of claim 6, wherein monitoring layer growth comprises the step of:

monitoring, during deposition, the layer growth, the layer of material having a high index of refraction being monitored via reflection high energy electron diffraction, the layer of material having a low index of refraction being monitored via interferometric technique capable of sub-angstrom resolution.

8. The process of claim 7, wherein monitoring intrinsic stress comprises the step of:

monitoring intrinsic stress using an in-situ cantilever-based intrinsic stress optical monitor.

9. The process of claim 8, wherein adjusting intrinsic stress comprises the step of:

adjusting the intrinsic stress via deposition parameter modification.

10. The process of claim 9, wherein monitoring indices of refraction comprises the step of:

monitoring indices of refraction during deposition via an in-situ ellipsometer.

11. The process of claim 10, wherein after monitoring indices of refraction during deposition via an in-situ ellipsometer, the process comprises the step of:

measuring surface roughness using a reflection technique selected from the group consisting of: p-polarized reflection spectroscopy, phase modulated ellipsometry, and real-time atomic force microscopy.

12. The process of claim 11, wherein depositing amorphous carbon onto the at least one layer comprises the step of:

depositing approximately a 1–10 nanometer thick first layer of amorphous carbon onto the layer of material having a high index of refraction.

13. The process of claim 12, wherein directing an ion beam onto the carbon coated layer comprises the step of:

directing an oxygen ion beam onto the carbon coated layer.

14. The process of claim 13, wherein smoothing the carbon coated layer comprises the steps of:

rastering the ion beam in a sweeping fashion to allow interaction with only the carbon which protrudes above average surface height, the rastering being continued until a top layer of carbon is reduced to the level of the highest peaks in the layer.

15. The process of claim 4, wherein depositing amorphous carbon onto the layer of material having a low index of refraction comprises the step of:

depositing approximately a 1–10 nanometer thick second layer of amorphous carbon onto the layer.

16. The process of claim 15, wherein directing an ion beam onto the carbon coated layer of material having a low index of refraction comprises the step of:

directing an oxygen ion beam onto the carbon coated layer.

17. The process of claim 16, wherein smoothing the carbon coated layer comprises the steps of:

rastering the ion beam in a sweeping fashion to allow interaction with only the carbon which protrudes above average surface height, the rastering being continued until a top layer of carbon is reduced to the level of the highest peaks in the layer; and, repeating the process as necessary, alternating the high and low index layers.

18. The process of claim 4, wherein the process further comprises the step of:

smoothing the carbon layer until the surface roughness is approximately legs than 0.1 nanometers.

19. A method of making an optical filter comprising the step of forming a layer of amorphous carbon between a layer of high index of refraction material and a layer of low index of refraction material.

20. The method of claim 19 further comprising the step of reducing the surface roughness of the carbon layer prior to depositing material on the carbon layer.

21. The method of claim 20 wherein the step of reducing the surface roughness of the carbon layer comprises the step of directing an ion beam at the surface.

22. The method of claim 21 wherein the ion beam comprises oxygen.

23. The method of claim 19 wherein the carbon layer comprises diamond like carbon.

24. A method of making an optical filter comprising the step of forming a layer of amorphous carbon between layers of materials having different indices of refraction.

25. A method of making an optical filter formed by alternating layers of materials having high and low indices of refraction, said method comprising the step of depositing amorphous carbon on at least one layer of material.

* * * * *